United States Patent
Forrest et al.

(10) Patent No.: US 11,428,731 B2
(45) Date of Patent: *Aug. 30, 2022

(54) SENSOR INTEGRATED CIRCUIT LOAD CURRENT MONITORING CIRCUITRY AND ASSOCIATED METHODS

(71) Applicant: Allegro MicroSystems, LLC, Manchester, NH (US)

(72) Inventors: Glenn A. Forrest, Bow, NH (US); Thomas J. Kovalcik, Barrington, NH (US); Wei Zhang, Nashua, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/172,450

(22) Filed: Feb. 10, 2021

(65) Prior Publication Data
US 2021/0165038 A1    Jun. 3, 2021

Related U.S. Application Data

(63) Continuation of application No. 16/251,556, filed on Jan. 18, 2019, now Pat. No. 10,948,537.

(51) Int. Cl.
*G01R 17/16*       (2006.01)
*G01R 31/28*       (2006.01)
(Continued)

(52) U.S. Cl.
CPC ..... *G01R 31/2851* (2013.01); *G01R 31/3012* (2013.01); *H01L 22/34* (2013.01)

(58) Field of Classification Search
CPC ........... G01R 31/2851; G01R 31/3012; G01R 17/16; G01R 31/00; H01L 22/34
See application file for complete search history.

(56) References Cited

U.S. PATENT DOCUMENTS 5,471,152 A * 11/1995 Gheewala .......... G01R 31/3016
                                                  324/73.1
6,473,280 B1 * 10/2002 Buxton ............... H02M 3/1584
                                                  307/140
(Continued)

OTHER PUBLICATIONS

U.S. Appl. No. 16/251,556, filed Jan. 18, 2019, Forrest, et al.
(Continued)

*Primary Examiner* — Jermele M Hollington
*Assistant Examiner* — Taqi R Nasir
(74) *Attorney, Agent, or Firm* — Daly, Crowley, Mofford & Durkee, LLP (57) ABSTRACT

A sensor integrated circuit including a regulator for generating a regulated voltage includes a digital load configured to draw a load current from the regulator in response to a clock signal during in situ operation and a comparator configured to determine the absence or presence of a fault during in situ operation. The load current is less than or equal to a predetermined level in the absence of a fault and is greater than the predetermined level in the presence of a fault. The comparator is responsive to the load current and to a threshold level and is configured to generate a comparator output signal having a level indicative of whether the load current is less than or greater than the threshold level in order to thereby determine the absence or presence of a fault during in situ operation, respectively.

12 Claims, 5 Drawing Sheets

(51) Int. Cl.
  *H01L 21/66* (2006.01)
  *G01R 31/30* (2006.01)

(56) References Cited

U.S. PATENT DOCUMENTS

| | | | |
|---|---|---|---|
| 6,677,739 B1* | 1/2004 | Bartol | H03K 17/302 323/284 |
| 2009/0024889 A1* | 1/2009 | Forrest | G01R 31/31724 714/E11.169 |

OTHER PUBLICATIONS

T.T.T., Inc.; "IDDQ Tutorial"; Digital Test Methods; www.ttt.com; 1996; 30 Pages.

Makar, et al.; "Iddq Test Pattern Generation for Scan Chain Latches and Flip-Flops"; Digest of Papers IEEE International Workshop on IDDQ Testing; Nov. 5-6, 1997; 5 Pages.

Rajsuman; "Iddq Testing for CMOS VLSI"; Proceedings of the IEEE; vol. 88; No. 4; Apr. 2000; 23 Pages.

Williams, et al.; "Iddq Test: Sensitivity Analysis of Scaling"; Test and Design Validity; Proceedings International Test Conference; Oct. 20-25, 1996; 7 Pages.

Xue, et al.; "Built-in Current Sensor for IDDQ Test"; IEEE International Workshop on Current and Defect Based Testing; 2004; 7 Pages.

U.S. Non-Final Office Action dated Oct. 26, 2020 for U.S. Appl. No. 16/251,556; 16 pages.

Response to U.S. Non-Final Office Action dated Oct. 26, 2020 for U.S. Appl. No. 16/251,556; Response filed on Dec. 21, 2020; 10 pages.

Notice of Allowance dated Jan. 14, 2021 for U.S. Appl. No. 16/251,556; 9 pages.

* cited by examiner

SENSOR INTEGRATED CIRCUIT LOAD CURRENT MONITORING CIRCUITRY AND ASSOCIATED METHODS

CROSS-REFERENCE TO RELATED APPLICATIONS

This application is a continuation of U.S. patent application Ser. No. 16/251,556, entitled "SENSOR INTEGRATED CIRCUIT LOAD CURRENT MONITORING CIRCUITRY AND ASSOCIATED METHODS," and filed on Jan. 18, 2019.

STATEMENT REGARDING FEDERALLY SPONSORED RESEARCH

Not Applicable.

FIELD

This invention relates generally to fault testing of sensor integrated circuits and more particularly to testing circuitry and methods for in situ fault testing.

BACKGROUND

Integrated Circuits (ICs) are used in a variety of sensing applications, many of which are have strict accuracy and reliability requirements due to their use in safety critical applications such as automotive applications. One example application is in sensing applications in which a circuit including one or more sensing elements (e.g., pressure sensing elements, temperature sensing elements, light sensing elements, acoustic sensing elements, and magnetic field sensing elements) is used to detect one or more parameters (e.g., pressure, temperature, light, sound, magnetic field). Magnetic field sensors, for example, are circuits including one or more magnetic field sensing elements, generally in combination with other circuit components (e.g., analog, digital and/or mixed signal components), and are used to detect a magnetic field.

In high precision applications such as automobiles, accuracy in magnetic field sensing, such as may be used to detect motion of a target object, can be critical. Engine ignition timing, for example, depends on consistent detection accuracy. As one example, when magnetic field sensing elements and/or other circuitry of a magnetic field sensor integrated circuit (IC) in an engine ignition timing system are damaged due to overstress conditions, detection accuracy by the magnetic field sensor IC, and the resulting accuracy or performance of the engine ignition timing system, can be negatively impacted. Furthermore, in safety critical applications such as automobiles, compliance with standards such as Automotive Safety Integrity Level (ASIL) standards, generally requires safety mechanisms to ensure accurate and reliable circuit operation.

As digital IC geometries become smaller and signal speeds become faster, fault testing becomes more challenging. Various fault conditions such as marginal contacts, vias, and/or interconnects can cause signal delay and other types of faults. Testing of digital circuitry can be complicated by the magnitude of logic gates and other circuitry and the resulting number of circuit nodes to be tested.

IC testing is often performed during manufacture, in a testing environment. Such testing includes exercising the circuitry in a manner intended to emulate in situ conditions (i.e., conditions to which the sensor is expected to be exposed in actual use in a particular application and environment).

SUMMARY

According to the disclosure, a sensor integrated circuit including a regulator for generating a regulated voltage includes a digital load configured to draw a load current from the regulator in response to a clock signal during in situ operation and a comparator configured to determine the absence or presence of a fault during in situ operation. The load current is less than or equal to a predetermined level in the absence of a fault and is greater than the predetermined level in the presence of a fault. The comparator is responsive to the load current and to a threshold level and is configured to generate a comparator output signal having a level indicative of whether the load current is less than or greater than the threshold level in order to thereby determine the absence or presence of a fault during in situ operation, respectively.

testing. In particular, faults arising from in situ conditions, such as faults caused by application elements and parameters and/or caused by manufacturing-related stresses (i.e., stresses due to IC installment and/or use), can be detected. Additionally, the fault testing is accomplished as a background function without adversely impacting circuit operation.

Features may include one or more of the following individually or in combination with other features. The digital load can include a plurality of domains, each domain corresponding to a respective plurality of logic gates and controlled by a respective clock signal, wherein the sensor integrated circuit further comprises a controller configured to generate the clock signal for each of the domains of the digital load. The sensor IC may further include a threshold generator configured to generate the threshold level, wherein the threshold level is a based on the number of domains comprising the digital load.

least one of the clock signals can corresponds to a high activity clock associated with a high sensor activity interval, at least one of the clock signals can correspond to a low activity clock associated with a low sensor activity interval, at least one of the clock signals can comprise both a high activity clock portion associated with a high sensor activity interval and a low activity clock portion associated with a low sensor activity interval, at least one of the clock signals can be periodic and/or at least one of the clock signals can be non-periodic.

The sensor IC may further include a latch responsive to the comparator output signal and configured to latch the comparator output signal at a detection time. The detection time can follow a low sensor activity interval. The detection time can substantially coincide with an edge of a clock pulse following a low sensor activity interval. The detection time can substantially coincide with a falling edge of the clock pulse following the low sensor activity interval.

Also described is a method of monitoring a digital load current including detecting a load current drawn by an integrated circuit comprising a plurality of digital load domains, during in situ operation, each digital load domain controlled by a respective clock signal, wherein detecting the load current comprises comparing the load current to a threshold level to generate a comparison result and indicating the absence of a fault when the load current is less than the threshold level and indicating the presence of a fault when the load current is greater than the threshold level.

Features may include one or more of the following individually or in combination with other features. Detecting the load current may further include enabling at least one first digital load domain controlled by a clock signal comprising a high activity clock interval, setting the threshold level, and enabling at least one second digital load domain controlled by a clock signal comprising a low activity clock interval. The method may further include latching the comparison result at a detection time, which detection time may follow the low activity clock interval. Indicating the absence or presence of a fault may include sampling the latched comparison result by a controller. Setting the threshold level may include setting the threshold level based on the number of digital load domains.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
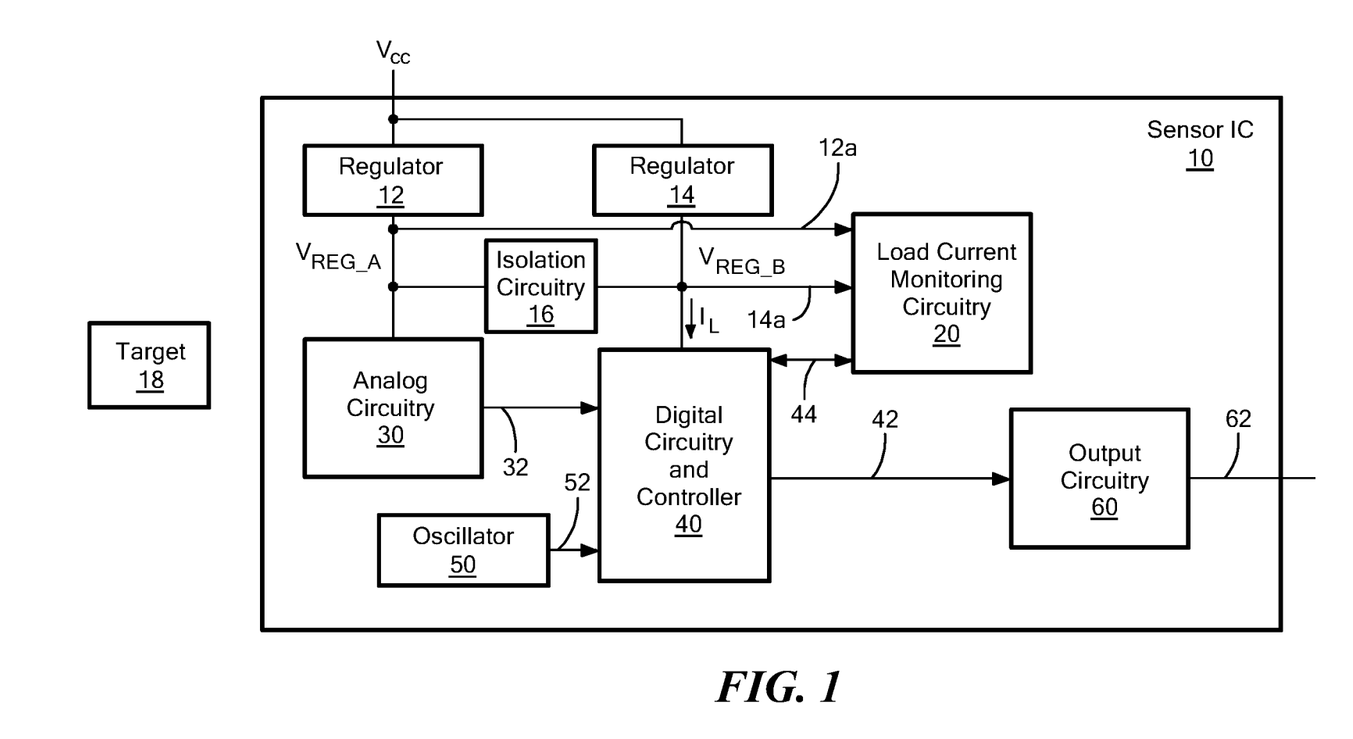
FIG. 1 is a block diagram of a sensor IC including fault testing circuitry for in situ fault testing according to the disclosure.

Referring to FIG. 1, a sensor IC 10 includes load current monitoring circuitry 20 according to the disclosure. The sensor IC 10 includes at least one regulator for generating a regulated voltage based on a supply voltage, VCC. Here the IC 10 includes a first regulator 12 for generating a first regulated voltage 12a, here a VREG_A voltage to power analog circuitry 30 and a second regulator 14 for generating a second regulated voltage 14a, here a VREG_D voltage to power digital circuitry and controller 40 (referred to alternatively as digital load 40). Isolation circuitry 16 can be coupled between the analog regulator 12 and the digital regulator 14 to prevent loading on the digital supply VREG_D by monitoring circuitry 20.

As used herein, the terms "processor" and "controller" are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory and/or in a discrete electronic circuit, which can be analog or digital. A processor or controller can contain internal processors or modules that perform portions of the function, operation, or sequence of operations. Similarly, a module can contain internal processors or internal modules that perform portions of the function, operation, or sequence of operations of the module.

An oscillator 50 is configured to generate an oscillator output signal 52 to control the digital circuitry and controller 40. More particularly, the digital load 40 can include a plurality of domains, each corresponding to a respective plurality of logic gates and controlled by a respective clock signal. The controller 40 can be configured to generate a master, or system clock signal in response to the oscillator output 52 and also to generate a plurality of domain clock signals based on the master clock signal. Output circuitry 60 can be coupled to receive signals 42 from the digital circuitry and controller 40 and to generate one or more sensor IC output signals. One such signal 42 from the controller 40 can include a fault detection signal (e.g., signal 42a in FIG. 2).

In operation, the digital circuitry and controller 40 draws a load current $I_L$ from the digital regulator 14 in response to one or more clock signals during in situ operation. Testing in situ refers to testing of the sensor IC 10 in its intended application, as contrasted to testing in a manufacturing setting. The load current $I_L$ is less than or equal to a predetermined level in the absence of a fault and is greater than the predetermined level in the presence of a fault. As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

The monitoring circuitry 20 is coupled to the analog regulator 12, the digital regulator 14, and the digital circuitry and controller 40 and is configured to monitor the load current to detect a fault. More particularly, the monitoring circuitry 20 may include a comparator (FIG. 2) responsive to the load current and to a threshold level or signal and generate a comparator output signal having a level indicative of whether the load current is less than or greater than the threshold level in order to thereby determine the absence or presence of a fault during in situ operation.

The sensor IC 10 may take various forms. As examples, the IC 10 can be a pressure sensor, an accelerometer, a flow sensor, or a magnetic field sensor for sensing one or more parameters of a target 18 based on variations in a magnetic field. In the case of a magnetic field sensor IC, analog circuitry 30 may include one or more magnetic field sensing elements. Sensing elements can take a variety of forms, including, but not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb). As used herein, the term "magnetic field signal" is used to describe any signal that results from a magnetic field experienced by a magnetic field sensing element.

Example magnetic field sensor types can include a rotation detector, a movement detector, a current sensor, or a proximity detector. A rotation detector can sense rotation of a target object 18, for example, advance and retreat of magnetic domains of a ring magnet or advance and retreat of gear teeth of a ferromagnetic gear. Target 18 can have a variety of forms, including, but not limited to a gear having gear teeth or a ring magnet having one or more pole pair. Also, linear arrangements of ferromagnetic objects that move linearly are possible. The term "movement detector" can be used to describe either a rotation detector or a magnetic field sensor that can sense different movement, e.g., linear movement, of a ferromagnetic object, for example, linear movement of magnetic domains of a ring magnet or linear movement of gear teeth of a ferromagnetic gear. A magnet can be placed at a variety of positions proximate to the target 18, resulting in fluctuations of a magnetic field proximate to the gear as the gear rotates in a so-called "back-bias" arrangement.

Magnetic field sensors are used in a variety of applications, including, but not limited to an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-bias or other magnet, and a magnetic field sensor that senses a magnetic field density of a magnetic field.

Analog circuitry 30 may additionally include other circuitry such as a front-end amplifier to process the magnetic field sensing element output signal to generate a further signal for coupling to an analog-to-digital converter (ADC) as may include one or more filters, such as a low pass filter and/or notch filter, and as may take the form of a sigma delta modulator to generate a digital magnetic field signal. The ADC may generate digital signals for coupling to and further processing by digital circuitry and controller 40.

It will be appreciated that the circuits and techniques described herein apply to any sensor type that contains digital circuitry 40 desired to be monitored for one or more fault conditions. The fault detection described herein relies on a difference between the digital circuitry load current $I_L$ in the presence of a fault and in the absence of a fault. The load current $I_L$ can be referred to as Iddq current to indicate a quiescent state current (i.e., when the digital circuitry is not switching because clock inputs are held at static states). Alternatively, when the IC 10 is being exercised in normal use (i.e., the digital circuitry is operating in response to dynamic clock signal inputs and is expected to draw a "shoot through" current at clock transitions), the load current $I_L$ can be referred to as Idd current. During normal operation in the intended application (i.e., in situ operation), it is not possible to turn off the clock signals and still remain fully operational. Thus, according to the disclosure, fault testing is performed while the digital domains receive their respective clock signals. However, in order to leverage fault detection by an expected difference between Iddq and Idd currents, the present circuits and techniques perform fault testing when the load current is as close to Iddq current as possible, but without adversely affecting sensor operation.

It will be appreciated that some digital domain clock signals have periods of inactivity or reduced activity as may be referred to as idle periods. During these idle periods, there may be more sparse or sporadic clock edges than at other times. These types of clock signals can be referred to as low activity clock signals and can be associated with a low sensor activity interval. High activity clock signals on the other hand refer to clock signals associated with a high sensor activity interval and generally do not have idle periods (or have very rare idle periods). Some clock signals can include both a high activity clock portion associated with a high sensor activity interval and a low activity clock portion associated with a low sensor activity interval. Furthermore, clock signals can be periodic or non-periodic.

In the case of an example magnetic field sensor in the form of a rotation detector, digital controller 40 processes signals 32 from the ADC of the analog circuitry 30 to determine the speed and/or direction of movement, such as rotation of target 18 and outputs one or more digital signals 42 to output circuit 60. More particularly, in this example sensor, controller 40 can determine the speed and/or direction of target 18 based on digital signals 32 and can combine this information with fault information in some embodiments to generate the sensor output signal 62 in various formats. The output circuitry 60 can provide the sensor output signal 62 in various formats, such as a so-called two-wire format in which the output signal is provided in the form of current pulses on the power connection to the sensor or a three-wire format in which the output signal is provided at a separate dedicated output connection. Formats of the output signal 62 can include variety of formats, for example a pulse-width modulated (PWM) signal format, a Single Edge Nibble Transmission (SENT) format, a Serial Peripheral Interface (SPI) format, a Local Interconnect Network (LIN) format, a CAN (Controller Area Network) format, an Inter-Integrated Circuit (I²C) format, or other similar signal formats.

In some applications, a system controller, such as an Engine Control Unit (ECU) in the case of an automotive application (not shown), can respond to fault information from the sensor 10 by commanding the sensor to operate in a certain manner in the presence of a fault. For example, in the presence of a major fault, the ECU may cause the sensor 10 to shut down; whereas, in the case of a minor fault, the ECU can cause the sensor to continue normal or modified operation.

Figure 2:
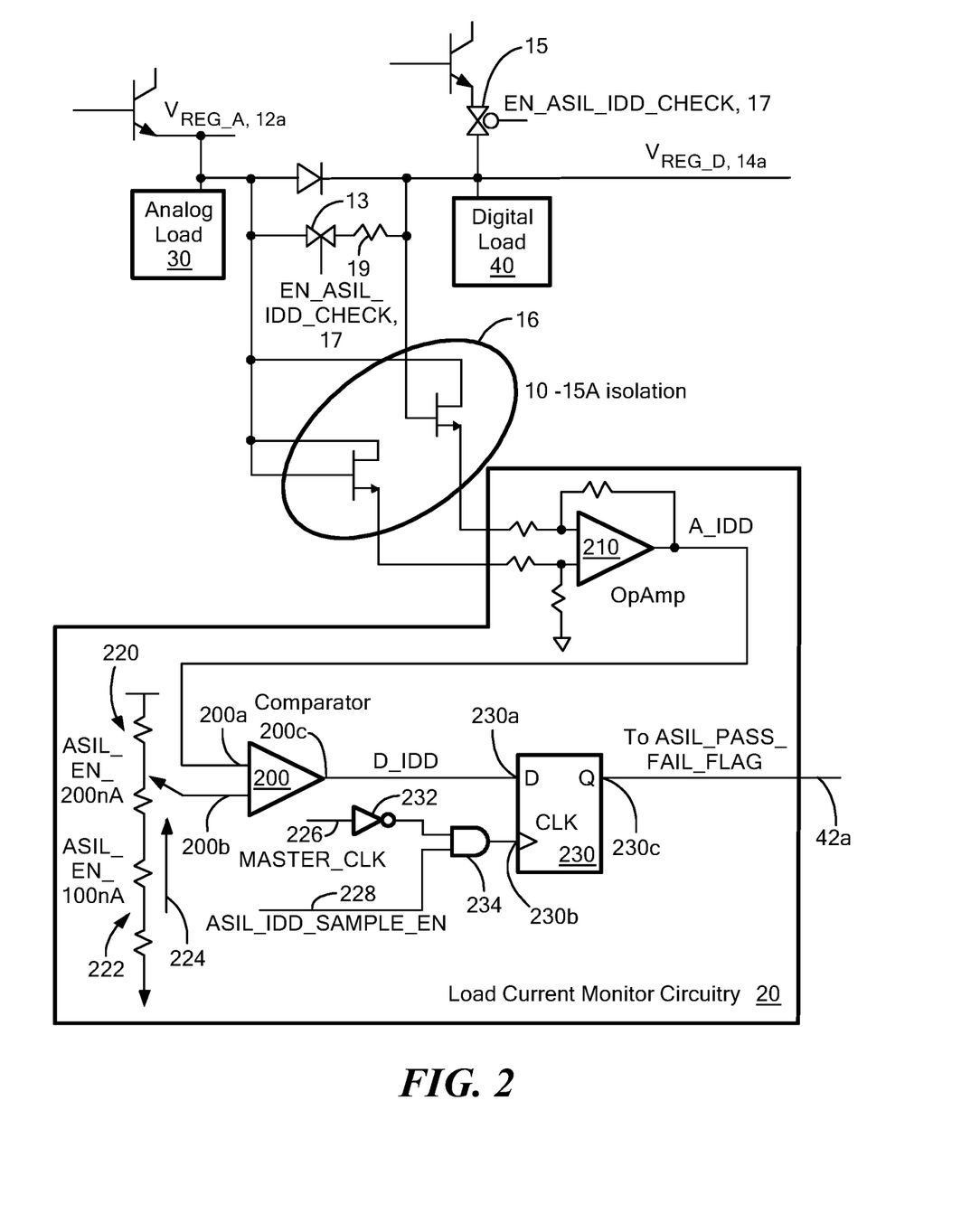
FIG. 2 is a block diagram of the load current monitoring circuitry of the sensor IC of FIG. 1.

Referring also to FIG. 2, a portion of the sensor IC 10 is shown to illustrate details of the load current monitoring circuitry 20. As noted above, the load current monitoring circuitry 20 is coupled to the analog regulated voltage VREG_A 12a and to the digital regulated voltage VREG_D 14a. Transmission gates 13, 15 can be provided to enable load current monitoring in response to an enable signal 17 (e.g., EN_ASIL_IDD_CHECK) from the controller. Closing transmission gate 13 can cause a predetermined resistance of resistor 19 to be provided between the analog and digital regulated voltages 12a, 14a and closing transmission gate 15 can couple the digital regulated voltage VREG_D 14a to the digital load 40 when it is desired to sample the load current by current monitoring circuit 20. For example, load current monitoring circuit 20 can sample the load current at a time when shoot through current to the digital load 40 has subsided (e.g., at the falling edge of a clock signal).

As noted above, load current monitoring circuitry 20 includes comparator 200 that is responsive to the load current $I_L$ at an input 200a and to a threshold level at an input 200b and configured to generate a comparator output signal at an output 200c having a level indicative of whether the load current is less than or greater than the threshold level in order to thereby determine the absence or presence of a fault during in situ operation, respectively. More particularly, an operational amplifier 210 can be coupled to the digital regulated voltage to generate a signal A_IDD proportional to the load current (i.e., the sampled load current). Isolation circuitry 16 (and in particular the right-most NMOS) ensures that the resistor loading of operational amplifier 210 does not load the VREG_D bus. The left-most NMOS of isolation circuitry 16 ensures that the voltage drop on both sides matches.

It should be understood that a so-called "comparator" can be comprised of an analog comparator having a two-state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

A threshold generator 220 can be provided to generate one or more threshold signals for comparison the A_IDD signal. In the example embodiment shown in FIG. 2, the threshold generator 220 is provided by a resistor divider 222 with selectable taps at intermediate nodes to generate different threshold voltage levels in response to a control signal 224. In general, the variable threshold level establishes the pass/fail point of the sensor. Various schemes are possible for establishing a threshold signal for comparison to the A_IDD signal. In some embodiments, a user can provide the signal 224 to thereby select the threshold level. Alternatively, one or more fuses can be blown to statically select a threshold level during manufacture of the sensor 10. As a further alternative, a state machine can be used to cycle through various threshold levels in a round-robin fashion.

The threshold level may be selected to be a lower threshold (i.e., a more aggressive threshold level closer to the Iddq level) or may be a higher level (i.e., a less aggressive threshold level closer to Idd than to Iddq). For example, in some embodiments, the threshold level is based on the number of concurrently active domains comprising the digital load. In particular, a lower threshold level may be selected (i.e., a more aggressive threshold level closer to the Iddq level) when there are fewer concurrently active domains (i.e., fewer clock edges); whereas a higher threshold level may be selected (i.e., a less aggressive threshold level closer to Idd than to Iddq) when there are more concurrently active domains (i.e., more clock edges).

A flip-flop 230 can be coupled to receive the comparator output signal at a D input 230a and generate a fault detection signal 42a at a Q output 230c (e.g., ASIL_PASS_FAIL_FLAG) for coupling to output circuitry 60 (FIG. 1). The flip-flop 230 can be clocked by a signal at its clock input 230b generated by the controller 40 (FIG. 1). In the example embodiment, a master clock signal 226 (MASTER_CLK) is inverted by inverter 232 and combined with a fault detection sample, or enable signal 228 (ASIL_IDD_SAMPLE_EN-ABLE) through an AND gate 234, as shown. With this arrangement, the flip-flop 230 samples on the opposite phase of the system or master clock signal 226 (i.e., at the falling edge of the master clock when shoot through current has subsided) and at times established by the enable signal 228. In some embodiments, safety specifications such as ASIL dictate the frequency at which the A_IDD signal is sampled.

Figure 3:
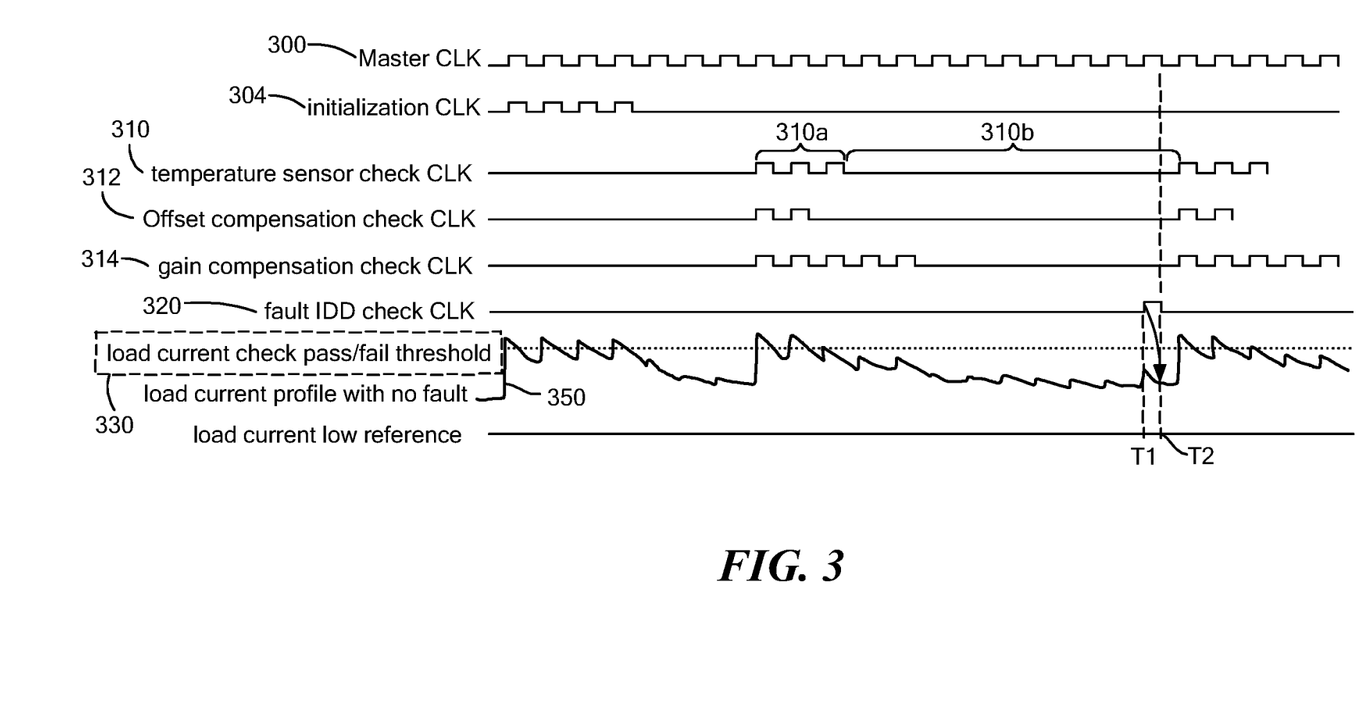
FIG. 3 is a graph including several waveforms associated with the load current monitoring circuitry of FIG. 2 in the absence of a fault.

Referring to FIG. 3, example waveforms associated with the sensor IC 10 of FIGS. 1 and 2 are shown in the absence of a fault. The illustrated waveforms include a master clock signal 300 (that can be the same as or similar to the master clock signal 226 of FIG. 2) as may be generated by the controller 40 in response to the oscillator signal 52. An initialization clock signal 304 can be generated by the controller 40 in response to the master clock signal 300. Each of clock signals 310, 312, and 314 corresponds to a clock signal generated by the controller 40 and intended to control a respective domain of the digital load circuitry. Example clock signals include a temperature sensor check clock signal 310 to control a temperature domain, an offset compensation check clock signal 312 to control an offset compensation domain, and a gain compensation check signal 314 to control a gain compensation domain. Clock signals 310, 312, and 314 are examples of clock signals having both high activity clock portions (e.g., as labeled 310a for clock signal 310) during which the clock signal is actively generating clock edges and low activity clock portions (e.g., as labeled 310b for clock signal 310) during which the clock signal is idle with fewer or no clock edges.

A fault IDD check clock signal 320 (that may be the same as or similar to the ASIL_IDD_SAMPLE_EN signal 228 of FIG. 2) controls the timing of fault detection by the load current monitoring circuitry 20. When asserted, the fault IDD check clock signal 320 causes the load current monitoring circuitry 20 to test the load current to determine whether the load current is less than or greater than the threshold level in order to thereby determine the absence or presence of a fault during in situ operation. The threshold level to which the comparator 200 (FIG. 2) compares the sampled load current signal 360 is labelled 330 and is referred to alternatively as the load current check pass/fail threshold. The load current signal 360 can be the same as or similar to the sampled load current A_IDD in FIG. 2. It will be appreciated that although clock signals 310, 312, and 314 have time coincident, or time simultaneous clock pulses (i.e., clock signals 310, 312, 314 can be described as having overlapping portions of high activity) other example clock signals can have non-simultaneous clock pulses (i.e., clock signals could alternatively have sequential high activity portions).

At a time labeled T1, a pulse on fault IDD check clock signal 320 causes the comparator output signal 226 (FIG. 2) to be latched by flip-flop 230, as occurs at a time labeled T2.

As shown, time T1 is as far from the interval of high clock activity as possible in order to sample the load current when it is as close to Iddq as possible. Stated differently, the detection time established by the fault IDD check clock signal pulse at time T1 follows a low sensor activity interval. It will be appreciated that for clock signals that do not have idle portions or portions of lower activity, it is not possible to sample the load current any closer to Iddq than would occur on the falling edges of the clock signal.

The condition of the load current signal 360 being below the threshold 330 at sampled time T1 is indicative of the absence of a fault.

Figure 3A:
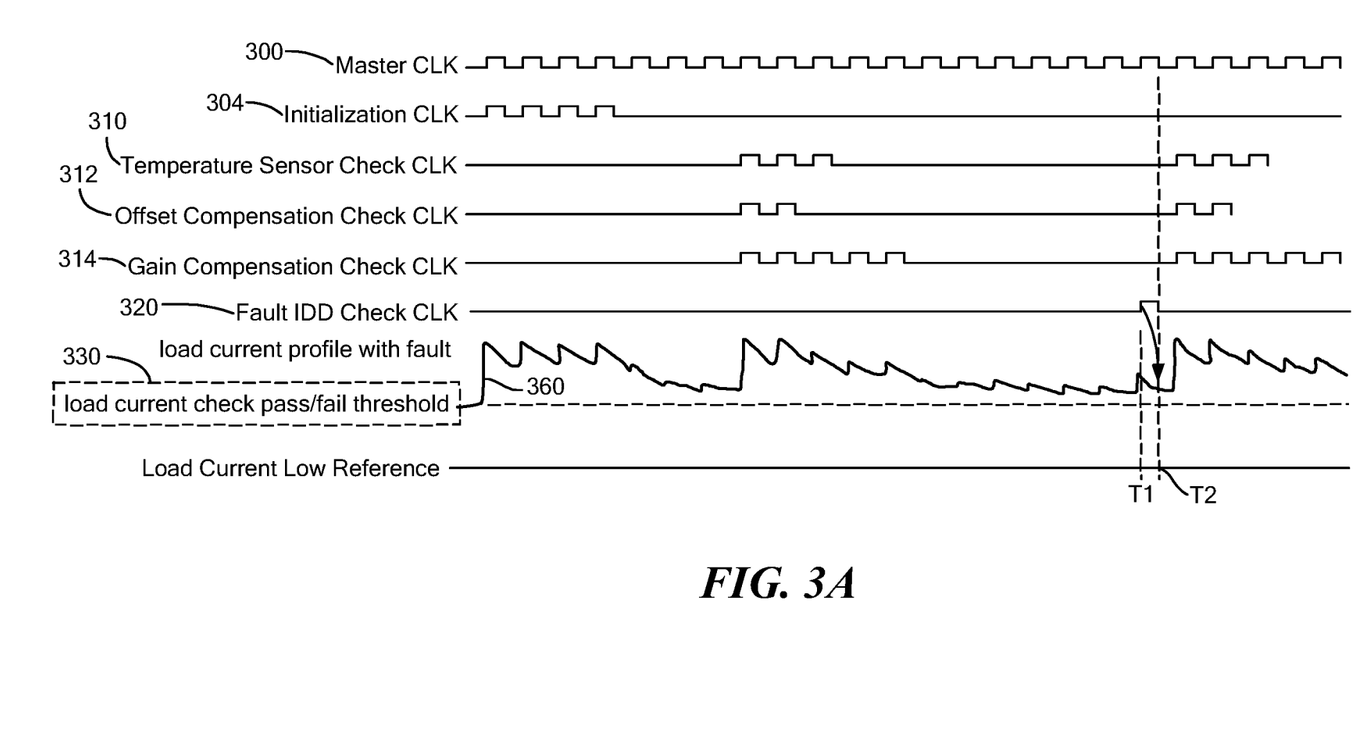
FIG. 3A is a graph including several waveforms associated with the load current monitoring circuitry of FIG. 2 in the presence of a fault.

Referring also to FIG. 3A, the same example clock signals as shown in FIG. 3 are here shown under operating conditions associated with a fault. More particularly, in FIG. 3A, at time T1 when a pulse on fault IDD check clock signal causes the comparator output signal 226 to be latched, a fault exists as is indicated by the condition of sampled load current signal 360 being above the threshold 330. The resulting fault indication can be a pass/fail indication without providing any further indication of which domain(s) is experiencing the fault or the system could have customized samples that would be triangulated to additionally provide an indication of which domain(s) experiences the fault.

Figure 4:
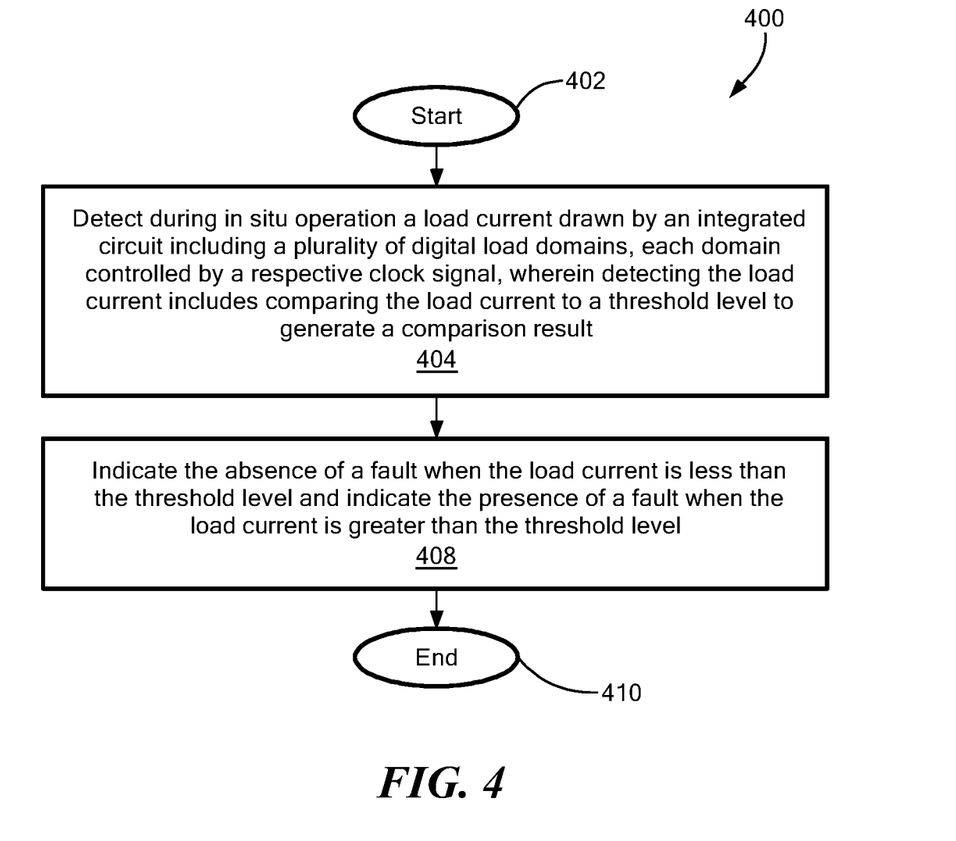
FIG. 4 is a flow diagram illustrating a process for in situ sensor IC fault testing based on load current monitoring.

Referring to FIG. 4, a flow diagram illustrates a method 400 of monitoring a digital load current during in situ operation. The method begins at block 402. In a block 404, a load current is sampled during in situ operation as may be initiated by an enable signal (e.g., ASIL_IDD_SAMPLE_EN 228, FIG. 2) and as may include comparing the sampled load current to a threshold level to generate a comparison result. The detected load current can be load current $I_L$ drawn by digital circuitry including a plurality of digital load domains, each domain controlled by a respective clock signal.

In embodiments, detecting the load current at block 404 can include enabling at least one first digital load domain controlled by a clock signal comprising a high activity clock interval, setting the threshold level, and enabling at least one second digital load domain controlled by a clock signal comprising a low activity clock interval. Setting the threshold level can include setting the threshold level based on the number of digital load domains. Detecting the load current at block 404 can further include latching the comparison result at a detection time. For example, the detection time can follow the low activity clock interval.

In block 408, the method includes indicating the absence of a fault when the load current is less than the threshold level and indicating the presence of a fault when the load current is greater than the threshold level. The fault indication can be provided to a system controller by output signal 42a (e.g., signal ASIL_PASS_FAIL_FLAG of FIG. 2) and indicating the absence or presence of a fault at block 408 can include sampling the latched comparison result by a controller. The method ends at block 410.

It will be appreciated that the method 400 is a "background" operation performed during normal in situ operation. In other words, the method does not interrupt normal operation controlled by domain clock signals; rather, the method calls for sampling the load current (block 404) at times of lower sensor activity where possible.

All references cited herein are hereby incorporated herein by reference in their entirety.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

Having described preferred embodiments, it will now become apparent to one of ordinary skill in the art that other embodiments incorporating their concepts may be used. Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

It is felt therefore that these embodiments should not be limited to disclosed embodiments, but rather should be limited only by the spirit and scope of the appended claims.

What is claimed is:

1. A sensor integrated circuit comprising a regulator for generating a regulated voltage based on a supply voltage coupled to the sensor integrated circuit, comprising:
   a digital load configured to draw a load current from the regulator in response to a clock signal during in situ operation, wherein the load current is less than or equal to a predetermined level in the absence of a fault and wherein the load current is greater than the predetermined level in the presence of a fault, wherein the clock signal corresponds to a low activity clock associated with a low sensor activity interval; and
   load current monitoring circuitry comprising:
      a comparator responsive to the load current and to a threshold level and configured to generate a comparator output signal having a level indicative of whether the load current is less than or greater than the threshold level in order to thereby determine the absence or presence of a fault during in situ operation, respectively,
   the load current monitoring circuitry configured to latch the comparator output signal at a detection time that follows the low sensor activity interval.

2. The sensor integrated circuit of claim 1, wherein the digital load comprises a plurality of domains, each domain corresponding to a respective plurality of logic gates and controlled by a respective clock signal, wherein the sensor integrated circuit further comprises a controller configured to generate the clock signal for each of the domains of the digital load.

3. The sensor integrated circuit of claim 2, further comprising a threshold generator configured to generate the threshold level, wherein the threshold level is a based on the number of domains comprising the digital load.

4. The sensor integrated circuit of claim 2, wherein at least one of the clock signals corresponds to a high activity clock associated with a high sensor activity interval.

5. The sensor integrated circuit of claim 2, wherein at least one of the clock signals corresponds to a low activity clock associated with a low sensor activity interval.

6. The sensor integrated circuit of claim 2, wherein at least one of the clock signals comprises both a high activity clock portion associated with a high sensor activity interval and a low activity clock portion associated with a low sensor activity interval.

7. The sensor integrated circuit of claim 2, wherein at least one of the clock signals is periodic.

8. The sensor integrated circuit of claim 2, wherein at least one of the clock signals is non-periodic.

9. The sensor integrated circuit of claim 1, further comprising a flip-flop responsive to the comparator output signal and configured to latch the comparator output signal at a detection time.

10. The sensor integrated circuit of claim 9, wherein the detection time follows a low sensor activity interval.

11. The sensor integrated circuit of claim 9, wherein the detection time substantially coincides with an edge of a clock pulse following a low sensor activity interval.

12. The sensor integrated circuit of claim 11, wherein the detection time substantially coincides with a falling edge of the clock pulse following the low sensor activity interval.

* * * * *

UNITED STATES PATENT AND TRADEMARK OFFICE
CERTIFICATE OF CORRECTION

PATENT NO. : 11,428,731 B2  
APPLICATION NO. : 17/172450  
DATED : August 30, 2022  
INVENTOR(S) : Glenn Forrest et al.

It is certified that error appears in the above-identified patent and that said Letters Patent is hereby corrected as shown below:

On the Title Page

In the illustrative figure, Line 6 approx., delete "VREG_B" and insert --VREG_D--.

In the Drawings

FIG. 1, delete "VREG_B" and replace with --VREG_D--.

FIG. 3, delete "350" and replace with --360--.

In the Specification

Column 2, Line 40 delete "least" and replace with --At least--.

Column 3, Line 50 delete "VREG_B" and replace with --VREG_D"--.

Column 3, Line 55 delete "VREG_B" and replace with --VREG_D"--.

Columns 7-8, Lines 67-1 delete "(ASIL_IDD_SAMPLE_ENABLE)" and replace with --(ASIL_IDD_SAMPLE_EN)--.

In the Claims

Column 10, Line 37 delete "is a based" and replace with --is based--.

Signed and Sealed this  
Twelfth Day of December, 2023

Katherine Kelly Vidal  
*Director of the United States Patent and Trademark Office*